United States Patent [19]

Richman

[11] Patent Number: 4,600,933
[45] Date of Patent: Jul. 15, 1986

[54] SEMICONDUCTOR INTEGRATED CIRCUIT STRUCTURE WITH SELECTIVELY MODIFIED INSULATION LAYER

[75] Inventor: Paul Richman, St. James, N.Y.

[73] Assignee: Standard Microsystems Corporation, Hauppauge, N.Y.

[21] Appl. No.: 49,916

[22] Filed: Jun. 19, 1979

Related U.S. Application Data

[60] Continuation-in-part of Ser. No. 826,867, Aug. 22, 1977, abandoned, which is a division of Ser. No. 750,368, Dec. 14, 1976.

[51] Int. Cl.⁴ .................................... H01L 29/78
[52] U.S. Cl. ................... 357/23.12; 357/41; 357/42; 357/59; 357/91
[58] Field of Search .............. 357/41, 91, 42, 23, 357/59

[56] References Cited

U.S. PATENT DOCUMENTS

| | | | |
|---|---|---|---|
| 3,632,436 | 1/1972 | Denning | 357/39 |
| 3,775,191 | 11/1973 | McQuhae | 357/41 |
| 3,837,071 | 9/1974 | Ronen | 357/41 |
| 3,865,651 | 2/1975 | Arita | 357/45 |
| 3,891,190 | 6/1975 | Vadasz | 357/59 |
| 3,914,855 | 10/1975 | Cheney et al. | 357/41 |
| 3,967,310 | 6/1976 | Horiuchi et al. | 357/54 |
| 3,999,210 | 12/1976 | Yamada | 357/23 |
| 4,033,797 | 7/1977 | Dill et al. | 357/23 |
| 4,059,826 | 11/1977 | Rogers | 357/41 |
| 4,085,498 | 4/1978 | Rideout | 357/41 |
| 4,145,701 | 3/1979 | Kawagoe | 357/41 |
| 4,208,727 | 6/1980 | Redwine et al. | 357/41 |
| 4,235,010 | 11/1980 | Kawagoe | 357/41 |

Primary Examiner—Joseph E. Clawson, Jr.
Attorney, Agent, or Firm—Hopgood, Calimafde, Kalil, Blaustein & Judlowe

[57] ABSTRACT

An integrated circuit structure includes a substrate, diffused regions formed in the upper surface of the substrate, and thin and thick insulative regions, polycrystalline regions, and metallic interconnections selectively formed overlying selected areas of the substrate surface. An insulating passivation layer overlying the integrated circuit provides mechanical protection for the integrated circuit. Openings are selectively formed in the passivation layer overlying a portion of the integrated circuit at a position other than that of a bonding pad, and above one of the polycrystalline regions positioned over one of the thin insulating regions. The openings may be used to perform ion implantation to modify the electrical characteristics, such as the threshold voltage, of the integrated circuit at those locations. The disturbance produced in the lattice structure of the silicon substrate during selective ion implantation may, in one aspect of the invention, not be annealed out in subsequent processing steps such that the remaining lattice disturbance further modifies the threshold voltage at the selected implanted locations.

2 Claims, 17 Drawing Figures

SEMICONDUCTOR INTEGRATED CIRCUIT STRUCTURE WITH SELECTIVELY MODIFIED INSULATION LAYER

This is a continuation-in-part application Ser. No. 826,867 filed Aug. 22, 1977, now abondoned which, in turn, is a divisional of application Ser. No. 750,368, filed Dec. 14, 1976.

The present invention relates generally to MOS devices, and more particularly to a method for selectively modifying desired electrical characteristics of MOS devices.

Recent developments in MOS (metal-oxide-silicon) technology have made possible the fabrication of a multiplicity of devices, such as FET's, in a small area, for use in such products as pocket calculators and microprocessors. One of the major components of these products is the read-only memory (ROM) in which a plurality (for example, 4,096 or 8,192) bits of data is stored or programmed in a preset matrix pattern. The stored data in the ROM may be employed, for example, to control the operation of other stages of the microprocessor, calculator, or the like in a known manner.

In the conventional MOS ROM each data bit is established by a single field-effect transistor (FET) arranged with the other data-storing FETS in an array or matrix consisting of intersecting rows and columns. The intersection of a row and a column defines a data location. The data stored at each location, to wit, a logic "1" or a logic "0", is determined by the electrical characteristics of the FET at each of the data locations. Thus, an FET which is conductive upon the application of a gate signal may define a logic "1", and an FET that cannot be made conductive upon the application of a gate signal may define a logic "0" signal.

The selective modification of the electrical characteristics of the FETs to establish the desired data-storage pattern in a ROM is conventionally achieved during one of the early (first or second photolithographic) stages of fabrication, by performing a photolighographic process using a mask conforming to the desired program or data pattern. Typically, in a conventional metal-gate read-only-memory, the second photolithographic mask is used to selectively form windows through a thick silicon dioxide film, and a thin insulating layer, such as silicon dioxide, is grown in the etched out regions, thereby establishing a relatively low threshold voltage for the FET to be subsequently formed at the locations defined by these regions, while the threshold voltages at the FETs which are to be subsequently formed where the thick silicon dioxide remains will be relatively high. Thus, the desired data pattern at the memory locations can be established. The fabrication of the ROM then continues by the performance of several additional masking steps to form, for example, the contact holes, and metalization and passivation layers, as is conventional.

Since the known ROM fabrication techniques require that the data program process masking procedure to establish the desired data pattern be performed at an early stage of fabrication, such as the second photolithographic operation, read-only memories which have different programs must be segregated and separately processed during the subsequent stages of their fabrication. Thus, to fabricate ROMs with different programs, the ROM manufacturer must, after the first or second photolithographic step, segregate wafers of each different data pattern into a separate lot or wafer run and maintain lot traceability for each lot or run. Thus, the read-only memory manufacturer is not able to inventory wafers at a late stage of fabrication for subsequent mask-programming, and the requirement for separate fabrication runs of ROMs having different stored programs significantly increases the cost and complexity of ROM fabrication.

ROMs, which are programmable after fabrication, known as field-programmable ROMs (pROMS), have been developed which permit the end user to program the memory in accordance with a desired data pattern by applying a preset sequence of electrical signals to the unprogrammed memory. Although the pROM offers the advantage of standardized fabrication for all memories, followed by subsequent data-pattern formation, the density of these memories is relatively low, typically between one-quarter to one-eighth that of the previously described mask-programmable ROMs. No electrically alterable or field-programmable ROMs, however, are presently available that have the high density and ease of fabrication that are associated with the conventional mask-programmable ROMs. Moreover, the low density of the known pROMs substantially reduces their effectiveness for use in a microprocessor, particularly one formed on a single chip. It is also desirable, for similar reasons, to modify other characteristics of MOS devices, such as the formation of enhancement- and depletion-mode MOS devices, at a late stage of device fabrication, rather than, as is presently required, at an early fabrication stage and, preferably, to do so without introducing any additional photolithographic operations.

It is accordingly an object of the invention to provide an integrated circuit capable of use in a high-density ROM, in which data programming is carried out at or near the last stage of fabrication.

It is a more general object of the present invention to provide a MOS integrated circuit in which a selected electrical characteristic of the MOS devices in the circuit can be selectively modified at or near the last stage of the fabrication process.

It is a further object of the invention to provide MOS devices, such as ROMs, which may be fabricated and then maintained in inventory, and later selectively modified in accordance with a desired pattern.

In the fabrication of MOS devices, it is conventional, at the last stage of fabrication, to form an overlying passivation layer to protect the chip. This layer is typically made of pyrolitically (chemically vapor deposited) silicon dioxide, but can also be formed by chemically depositing silicon nitride, phosphorus-doped silicon dioxide, or other materials. After the passivating layer is deposited, a photolithographic operation is performed to define windows at bonding pad locations and the passivating dielectric material is subsequently etched away at these locations in order to enable one to probe each die and then attach bonding wires to the device during the assembly operation.

In the present invention, in accordance with one embodiment thereof, the passivation layer is etched away from additional locations within the MOS array besides the bonding pads and is employed as a mask in the selective modification of certain electrical characteristics, for example, the threshold voltage of the previously formed MOS devices. In a particular embodiment of the invention, the passivation layer is employed as an implantation barrier and ion implantation is performed to form implantation layers at selective channel locations, thereby to program a high-density ROM at virtually the last stage of its fabrication. In one aspect of the invention, the damage to the crystal lattice produced during ion implantation is maintained and is used to further modify the threshold voltage of the selected locations.

To the accomplishment of the above and further objects as may hereinafter appear, the present invention relates to a novel MOS integrated circuit structure, substantially as defined in the appended claims and as described in the following specification, as considered with the accompanying drawings, in which:

FIGS. 1(a)–1(g) are partial cross-sectional views illustrating some of the steps employed in fabricating an MOS integrated circuit in accordance with one embodiment of the invention;

Figure 1A:
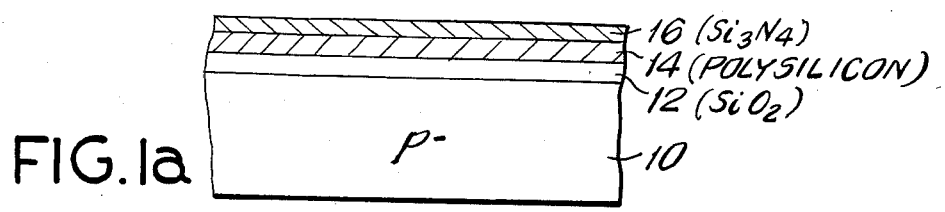
Figure 1B:
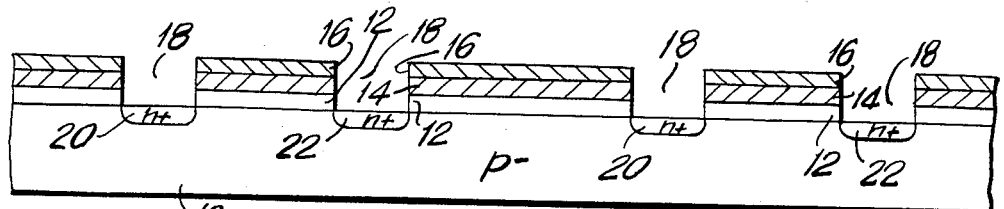

The steps illustrated in FIGS. 1(a)–1(g) are part of a process employed to fabricate a ROM, with the coding of the ROM being performed in a late stage of the process. The process begins with the forming of the structure shown in FIG. 1(a), which includes a p-type (100) substrate 10 on which is thermally grown a relatively thin (1,000Å to 1,500Å) layer 12 of silicon dioxide, $S_iO_2$. Layer 12 is immediately covered with a thicker (in the order of 2,000Å to 4,000Å) layer 14 of arsenic-doped polysilicon upon which a layer 16 of silicon nitride $Si_3N_4$ is deposited, such as by a chemical deposition process, to a thickness of between 1,000Å to 2,500Å. Alternately, other slow diffusants, such as antimony, may be used to dope the polycrystalline layer 14.

Thereafter, a first photolithographic operation is performed on the structure of FIG. 1(a) to define the windows 18 at the locations of the source and drain regions of the FETs that are to define the data locations in the ROM. In this operation, portions of the silicon nitride layer 16 are selectively removed at the window location. Then, using the remaining silicon nitride layer as a mask, the exposed portions of the polysilicon layer 14 and the underlying silicon dioxide layer 12 are removed as by etching to define the windows. Thereafter, n+-type impurities, such as phosphorus, are introduced, such as by diffusion or ion implantation, into the surface of the substrate to form the n+ source and drain regions 20 and 22 (FIG. 1(b)).

A second photolithographic operation is then performed to remove portions of the silicon nitride layer 16 over the field or parasitic regions, allowing the nitride layer to remain at the gate regions of the locations of the proposed FETs. Portions of the polysilicon layer 14 from which the overlying nitride film have been removed are then either completely thermally oxidized and thus converted to silicon dioxide (not shown) using the remaining nitride layer as a mask against the oxidization of the remaining polysilicon layer, or alternately, are etched away using the nitride layer as a mask, after a thermal oxidation of the n+ regions 20 and 22 to protect them from the effects of the subsequent polysilicon etch.

Figure 1C:
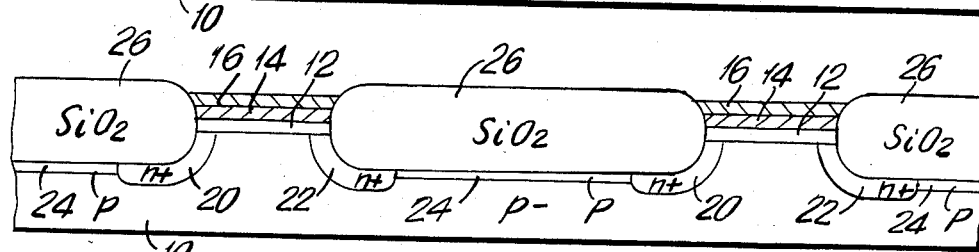

The exposed portions of the silicon dioxide layer are then etched away and, as shown in FIG. 1(c), a thin (in the order of 1,000Å) layer of silicon dioxide (not shown) is thermally grown over the unprotected source, drain, and field regions, after which a low-level implant of boron ions is carried out into and through this oxide layer and into the source, drain, and field regions, with the remaining nitride layer and underlying polysilicon layer at the gate regions acting as an implantation barrier. This implantation operation forms a p-type layer 24 at the field regions for the purposes described in U.S. Pat. No. 3,751,722.

The structure at this stage of the process is then placed into an oxidizing environment, whereby the portions of the wafer that are not covered by the remaining nitride layer 16 are oxidized to form a thick silicon oxide region 26 at the field regions, which overlies the p-type layer 24.

Figure 1D:
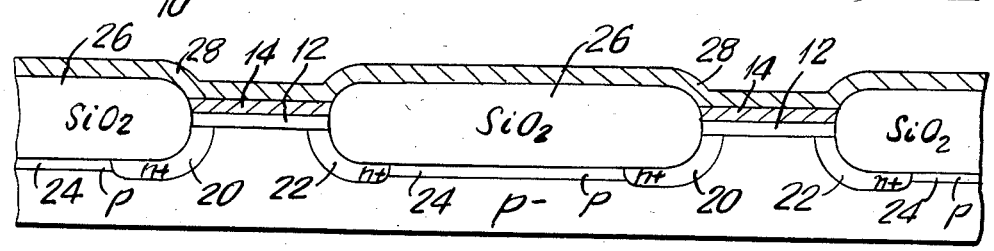

The remaining nitride layer 16 is then removed, such as by the use of a hot phosphoric acid, and desired contacts through the thick silicon dioxide region 26 to any of the various n+ diffused regions are defined and etched using a conventional photolithographic technique, and a second (n+ doped) layer of polycrystalline silicon 28 is then deposited over the structure to a thickness of between 1000Å and 3,000Å (FIG. 1(d)). A metal layer 30 is deposited directly on top of the doped polysilicon layers over the entire surface of the wafer. The metalization pattern is then defined and etched, and the underlying second layer 28 of the polysilicon is etched away from all areas that are not covered by metal, using the remaining metal layer as a mask. The etch employed to etch the polycrystalline silicon will not materially attack either the metal or the silicon dioxide.

Figure 1E:
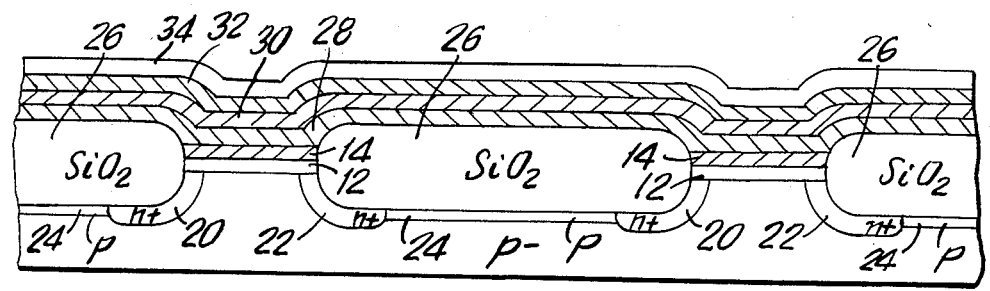
Figure 1F:
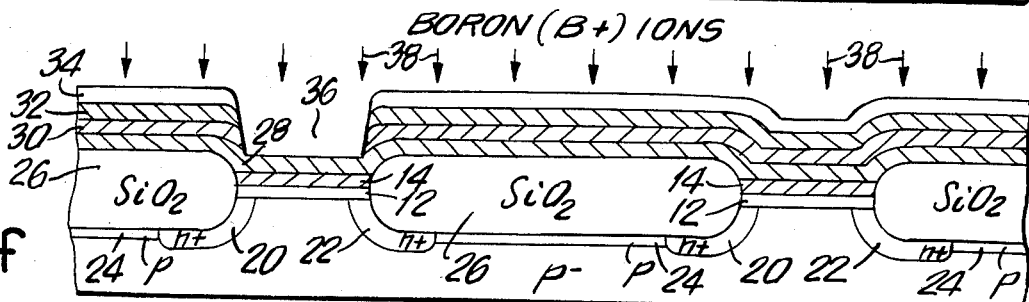
Figure 1G:
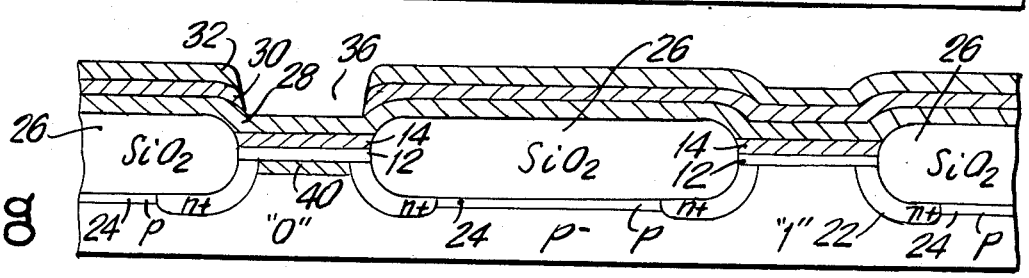

As shown in FIG. 1(e), at this stage of the process, the metalization pattern remains over all rows of the ROM matrix defined by the FETs that have been formed (two of which are shown in FIG. 1(e)) and thus remains over all portions of the gate regions of these transistors. A passivation layer 32, which may be chemical-vapor deposited silicon dioxide, is then deposited over the surface of the wafer to a thickness of between 3,000Å and 10,000Å, and the passivation layer is covered by a photoresist 34.

The ROM at this late stage of the fabrication process, is now coded to define the desired stored data pattern. To this end, the photoresist 34 is patterned and etched to define windows, such as 36 (FIG. 1(f)), over every gate or bit location in the ROM at which it is desired to store a logic "0" or "off" state. The silicon dioxide passivation layer is then etched away and the remaining photoresist and underlying silicon oxide of the passivation layer are used as a mask to etch away the exposed metal layer 30, such as by using a plasma etching technique or a chemical etch.

Once the metal has been removed from the desired gate locations, the wafer is subjected to a high-energy (e.g. 150 KeV or higher) implant of singly-ionized boron (B+) ions, as indicated at 38. Alternately, doubly-ionized boron ions of lower energy may be employed. The ions are of sufficient energy to penetrate through the polycrystalline layers 14 and 28 and silicon dioxide layer 12 to the underlying substrate to form an implanted layer 40 (with a higher concentration of boron atoms than in the substrate) in the channel region of the left-hand transistor which extends between the source and drain regions 20 and 22 (FIG. 1(g)). The wafer is then subjected to a low-temperature anneal in hydrogen at a temperature of between 440° C. and 500° C. to reduce radiation damage and fast states, and in a subsequent photolithographic operation, the passivation layer is again selectively etched away to define the areas for pad location.

The threshold voltage of an MOS device may be expressed according to the following equation:

$$V_T = \left( \frac{-Q_{SS} - Q_{SDmax} - Q_{ST}}{\epsilon_{ox}} \right) T_{ox} + \phi'_{MS} + 2\phi_F$$

where $V_T$ is the threshold voltage, $Q_{SS}$ is the fixed positive interface charge density per unit area at the silicon-silicon dioxide interface, $Q_{SDmax}$ is the maximum value of the charge density in the surface depletion region per unit area, $Q_{ST}$ is the charge density located in surface traps at the silicon-silicon dioxide interface per unit area, $\epsilon_{ox}$ is the dielectric constant of the gate oxide layer, $T_{ox}$ is the thickness of the gate oxide, $\phi_{MS}{}^i$ is the metal-semiconductor (or gate-substrate) work function difference, and $\phi_F$ is the Fermi potential associated with the silicon substrate. The implantation of boron ions results in an increase in the value of $Q_{SDmax}$ the maximum value of the charge density in the surface depletion region per unit area, in layer 40 according to the following equation:

$$Q_{SDmax} \simeq -\sqrt{4q\epsilon_s N_A \phi_F},$$

where q is the charge on an electron, $\epsilon_s$ is the dielectric constant of silicon, and $N_A$ is the effective number of electrically active acceptors per cubic centimeter in implant layer 40. Consequently, as a result of the increase in $Q_{SDmax}$ caused by the implantation of boron ions into the surface of the silicon, there is a positive shift in the threshold voltage, in the manner established by equation 1.

The crystal lattice of the upper portion of the substrate is disturbed during the ion-implantation operation, creating a state of significant disorder in the silicon lattice. In a conventional MOS integrated circuit fabrication process, virtually all this lattice disturbance is removed, or annealed out, during subsequent high-temperature processing steps performed at temperatures above 800 degrees C. However, in accordance with this invention, as exemplifed in FIG. 1 and in the other embodiments to be described subsequently, since the annealing is carried out after the formation of the metallization layer, which is commonly composed of aluminum, the annealing is carried out at a relatively low temperature of between 440 degrees C. and 500 degrees C., as compared to a conventional annealing temperature of about 1,000 degrees C. At this relatively low annealing temperature, which is performed in a hydrogen ambient from 20 to 100 minutes, the lattice disorder in the implanted surface regions of the substrate will only be partially corrected.

The additional lattice disturbance, or disorder, produced in the implant layer 40 in this manner, which is conventionally considered as being disadvantageous to a fabricated MOS device, has been found to provide the beneficial effect of further increasing the threshold voltage and decreasing the mobility of carriers in the channel regions associated with those MOS transistors in which ion-implantation has been selectively performed in the manner described. Specifically, as a result of the disorder caused in the periodicity and structure of the silicon lattice at and near the surface of the silicon over the implant layer 40, a large number of surface traps are created which can trap and, thus, immobilize electrons. For the energies and dosages previously described for the boron ion-implantation, the magnitude of the number of electrons per unit area trapped in these surface traps, which are created by the implantation, can be made to be greater than $10^{11}/cm^2$. That is:

$$\left| \frac{Q_{ST}}{q} \right| > 10^{11}/cm^2.$$

Thus, if the damage to the silicon lattice caused during the ion-implantation process is not annealed out (which will be the case as long as the annealing temperature is kept below 500 degrees C.), the term $Q_{ST}$, since it is negative because of the negative charge on an electron, will tend to significantly shift the threshold voltage even further in the positive direction, according to equation 1.

Because of the additive nature of the effects of $Q_{SDmax}$ and $Q_{ST}$ upon the threshold voltage, it is possible to achieve both a high value of threshold voltage and a comparably high value of the breakdown voltage of the drain-to-substrate diode, a situation which is highly advantageous in the construction of, for example, a read-only-memory matrix. This situation would be difficult to achieve without either of the effects of $Q_{SDmax}$ or $Q_{ST}$. Specifically, for gate oxide thicknesses of about 1,000Å, silicon gate MOSFETs fabricated on 15 ohm-cm. p-type 1-0-0 silicon wafers can easily be made to exhibit both threshold voltages and drain breakdown voltages simultanously in excess of 10 volts when implanted with boron atoms at 150 KeV and dosages in excess of $6 \times 10^{13}/cm.^2$ (for polysilicon layer thicknesses on the order of 3,000Å).

For a sufficient dosage of boron ions (typically between $10^{11}$ and $10^{14}$ ions/cm$^2$, the implant layer 40, wherever it has been formed, thus has the effect of shifting the threshold voltage associated with the gate region of the n-channel FET in a positive direction. The threshold voltages associated with the exposed FETs thus become more positive as a result of this ion implantation, such that when a positive voltage is applied to the conducting line over the bit at which the implant region is thus formed, the transistor will not turn on, no current flow will be detected between the drain and source, and the bit will be recognized as a logic "0", as indicated for the left-hand transistor of FIG. 1(g). However, at any bit location over which no window was etched away in the passivation layer, the metal and passivation material remaining over those transistor gate regions will provide an effective implantation barrier, and accordingly no ion implantation will occur at these locations. Electrical continuity along each conducting row of the ROM matrix is effected by the electrical conductivity of the metal layer and underlying doped polycrystalline silicon layer, and where the former has been removed at "0" bit locations, the remaining polysilicon layer provides the conduction path. A transistor at a location such as that at the right of FIG. 1(g), will turn on at a low voltage when a potential is applied to the metal line, current flow will be caused and detected between the drain and source, and the bit will be recognized to be a logic "1", as indicated.

Figure 2:
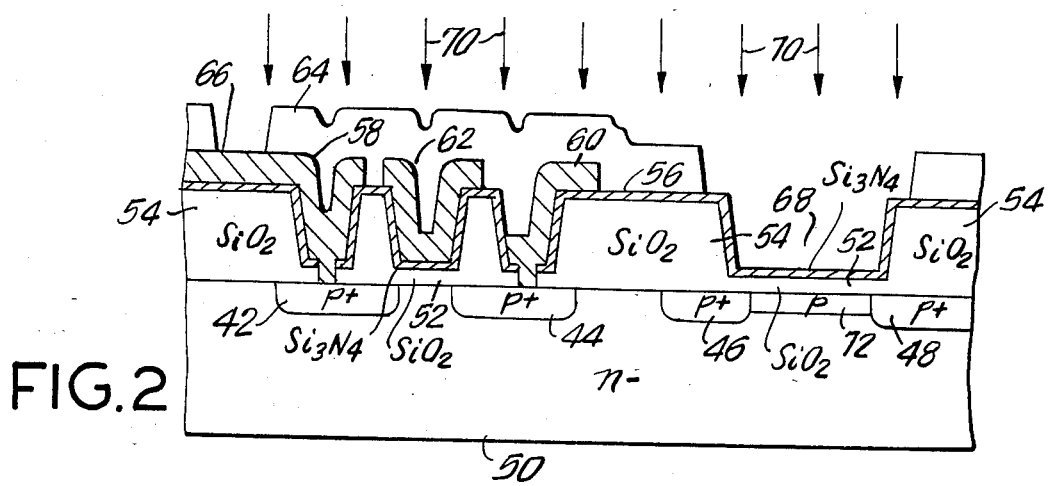
FIG. 2 is a partial cross-sectional view of an MOS device fabricated according to a second embodiment of the invention.

FIG. 2 illustrates the selective formation of a resistor, interconnect, or conducting layer between two previously nonrelated diffused regions. As therein shown, p+ regions 42, 44, 46, and 48 are formed in the upper surface of an n-type silicon substrate 50. A thin silicon dioxide layer 52 and thermally grown thick oxide regions 54 are formed on the substrate, and a thin silicon nitride 56 film is formed overlying the silicon dioxide regions and layer. Openings are formed in the thin oxide layer to permit contact between metal electrodes 58 and 60 to the p+ source and drain regions 42 and 44, respectively. A gate metal electrode 62 is formed over the gate region insulating layers 52 and 56. Thereafter, a layer 64 of a passivating dielectric material is deposited over the top surface of the entire structure, and, as is conventional, a mask is defined and etched to form openings, such as 66, extending to the metal at those pad locations at which it is desired to make contact to the metal.

In accordance with this embodiment of the invention, in addition to forming windows at the pad locations during the pad mask operation, additional windows such as 68 are opened at regions overlying selected thin oxide insulation regions that are not covered by metal during the formation of the metalization pattern. That is, during the etching process in which openings through the passivation layer to the metal at pad locations are formed, the passivation layer is also etched away down to the silicon nitride layer overlying the thin oxide insulating region.

The wafer is then subjected to a medium-energy implant of boron ions, as indicated at 70 (for an n-type substrate as in FIG. 2), or phosphorus ions (for a p-type substrate). The ions are of sufficient energy to be able to pass through the multilayer insulator regions of nitride layer 56 and oxide layer 52, where those layers are exposed during the etching away of the passivation layer, and into the surface of the substrate to form a p-type implanted layer 72 that extends between and interconnects the nonrelated p+ regions 46 and 48.

Thus, with the structure of FIG. 2, it is possible to program an interconnection (conducting layer) between two previous nonrelated heavily diffused regions at the final masking step, whereas before this had to be done at earlier photolithographic operations. If no connection is desired at the particular region where a thin multilayer insulator does not have metal covering it, no opening is made there during the pad mask operation, and the remaining passivating layer above this region provides a barrier to the implantation of ions into the silicon, so that the two nonrelated diffused regions remain unconnected, as desired.

After the ion implantation is performed, the wafer is then alloyed in either hydrogen or nitrogen at temperatures below 500° C. in order to alloy all contact locations, eliminate radiation damage created during the metalization step, and, as described previously, reduce the damage to the silicon lattice that was produced during ion implantation, and electrically activate more of the implanted atoms at locations where the implantation has penetrated the silicon surface.

Figure 3:
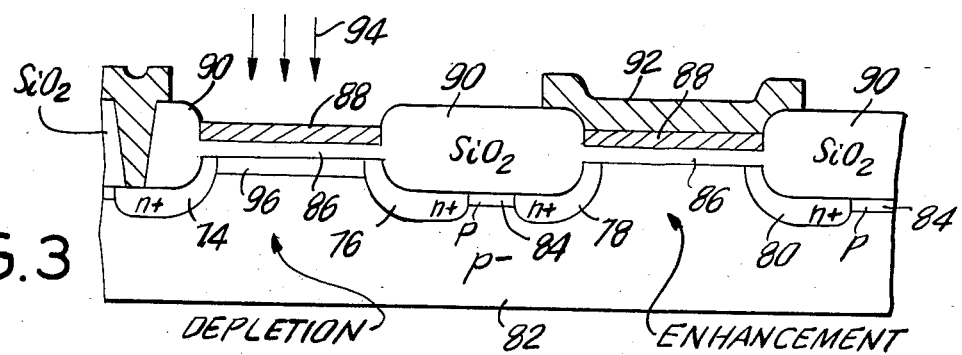
FIG. 3 is a partial cross-sectional view of an MOS device fabricated according to a third embodiment of the invention.

FIG. 3 illustrates a structure in which depletion devices are formed without the need for any additional photolithographic operation. As therein shown, n+ regions 74, 76, 78 and 80 are formed in the upper surface of a p-type silicon substrate 82. P-type regions 84 with acceptor concentrations greater than in the substrate are formed in the surface of the substrate and extend between nonrelated n+ regions, as described above with respect to the embodiment of FIG. 1. The gate regions are covered with a thin oxide insulating region 86 and a doped polysilicon layer 88, and the field regions are covered with a thick silicon dioxide region 90.

In accordance with this embodiment, the metalization pattern is designed such that metal, such as at 92, covers the polysilicon gate of only those transistors that are to be of the enhancement type, whereas the gates of transistors that are to be of the depletion type—such as the left transistor in FIG. 3—are not covered by metal.

The wafer, as it is shown in FIG. 3, is then subjected to an ion implantation of singly- or doubly-ionized n-type (phosphorus) ions as indicated at 94. The ions are of sufficient energy to pass through the exposed polysilicon layer 88 and the underlying oxide layer into the substrate to form an implanted n-type channel 96 at the gate of the left transistor in FIG. 3. The formation of channel 96 so modifies the threshold voltage associated with the left transistor as to convert that transistor into a depletion-mode device. The metal layer 92 acts as an implantation barrier so that no n-type channel is formed at the gate of the right transistor, which, accordingly, remains of the enhancement-mode type. The wafer is then subjected to a low temperature (440° C. to 500° C.) anneal in hydrogen. Contact to the silicon gate of the depletion-mode transistor with a metal line can be accomplished by extending the silicon gate over the field region and running any metal line right over it, thereby establishing contact between the gate and the metal.

Figure 4:
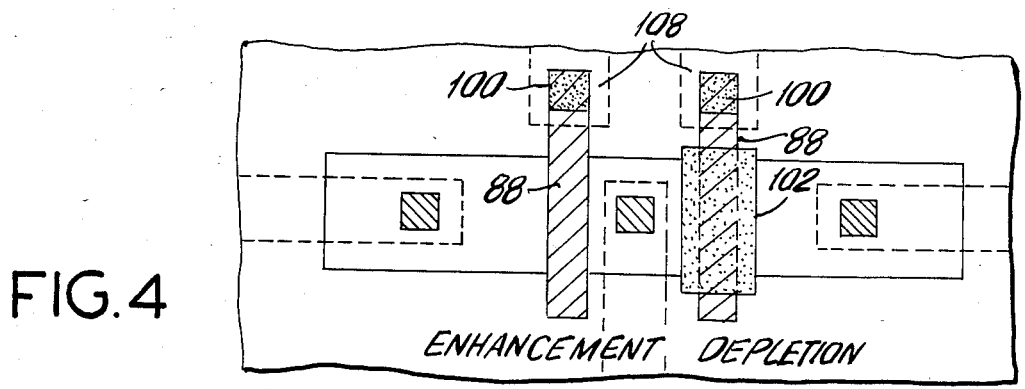
FIG. 4 is a plan view of a topological layout of a portion of an MOS device in accordance with another embodiment of the invention.
Figure 5:
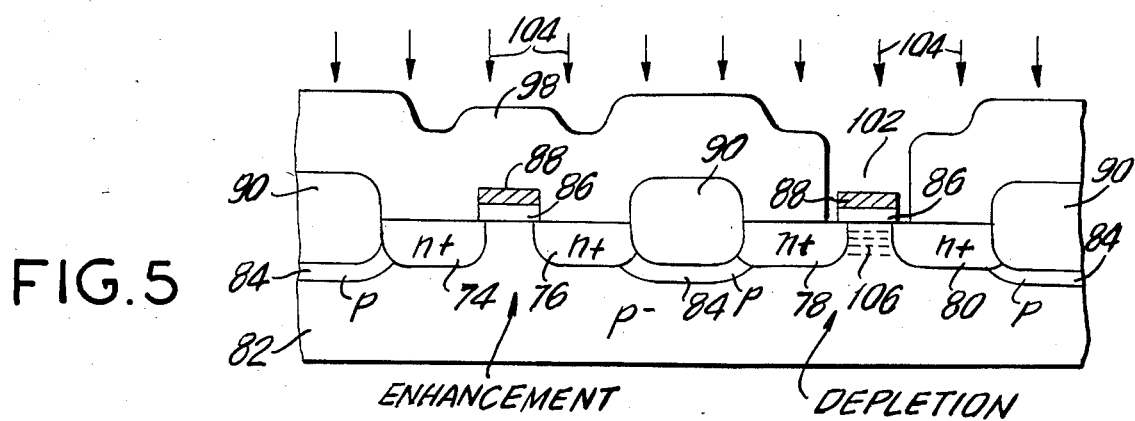
FIG. 5 is a cross-sectional view of the MOS device of FIG. 4.

FIGS. 4 and 5 illustrate another silicon-gate MOS structure in which enhancement- and depletion-mode devices are formed without the need for additional masking steps. As therein shown, a phosphosilicate glass layer is formed over the wafer during fabrication to separate the overlying metalization (not shown in FIG. 5) from the doped polysilicon gate structure. In FIGS. 4 and 5, which illustrate the fabrication of an n-channel MOS device, portions of the device that correspond to those also included in the structure of FIG. 3 are designated by common reference numerals to those employed in FIG. 3. It should be noted that the fabrication procedure employed to fabricate the structure described in FIGS. 4 and 5 results in coplanar drain, source, and channel regions.

Openings 100 are conventionally etched in the phosphosilicate layer during the contact photolithographic step to form openings through which contact is selectively made to the source, drain, and gate regions. In this embodiment, additional openings, such as at 102, are formed during the contact photolithographic step over the gate regions of the desired depletion-mode devices. Once the contact and depletion-mode gate windows are thus formed, the wafer is subjected to a singly- or doubly-ionized high-energy ion-implantation process, as indicated by the arrows 104, with the remaining phosphosilicate glass acting as an implantation barrier. Alternately, the resist used to define the contact holes may be left on after etch to provide an additional barrier. The implantation operation causes n-type ions to pass through the polysilicon gate structure of the right-hand device in FIG. 5 to form an n-type implanted channel 106 at the surface of the p-type substrate beneath this silicon gate structure. As described previously, this channel modifies the threshold voltage associated with this gate region to form a depletion-mode device.

Thereafter, as shown in FIG. 4, but not in FIG. 5 for clarity, the metal contacts 108 are formed to contact the source and gate regions through the contact openings and a passivation layer is formed over the entire structure, as is conventional.

Figure 6:
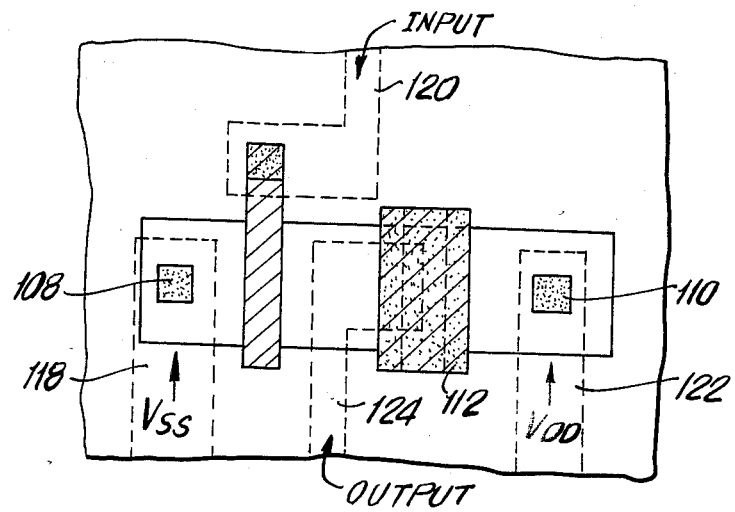
FIG. 6 is a plan view of a topological layout of a portion of an MOS device illustrating a further embodiment of the invention.
Figure 7:
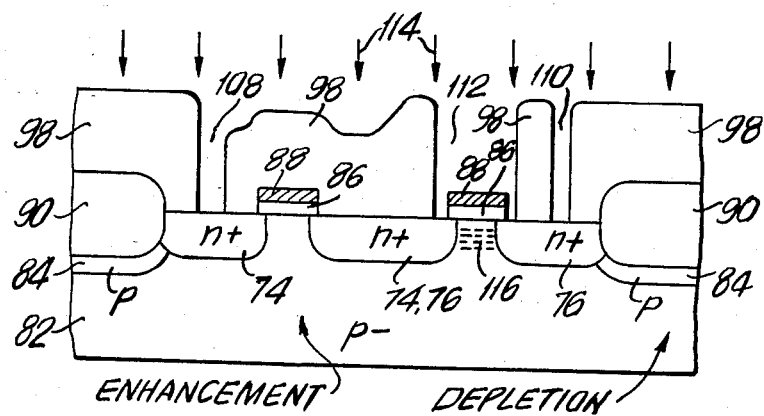
FIG. 7 is a cross-sectional view of the MOS device of FIG. 6.
Figure 8:
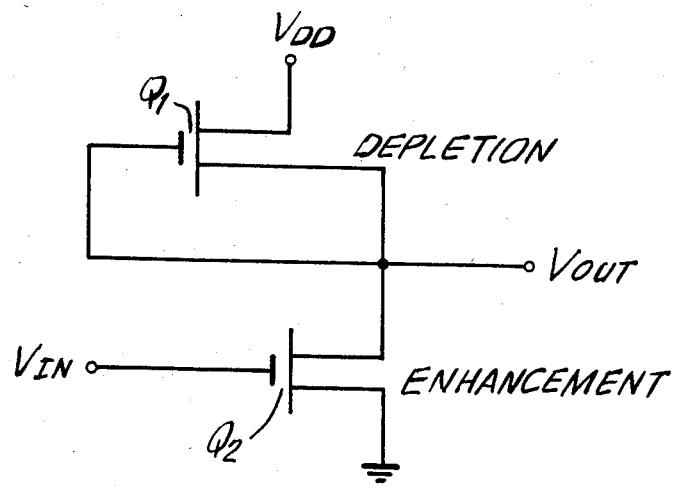
FIG. 8 is a circuit diagram of an inverter circuit implemented by the MOS structure fabricated in accordance with the process illustrated in FIGS. 6 and 7.

FIGS. 6 and 7 illustrate the fabrication of an MOS inverter circuit with a depletion-type load element as shown in FIG. 8, which is also described at page 221 of *MOS FIELD EFFECT TRANSISTORS AND INTEGRATED CIRCUITS*, by Paul Richman, published by John Wiley & Sons, in 1973. Referring to FIG. 8, it will be noted that the gate and source of the depletion mode-device Q1 are connected to one another and to the output terminal.

FIG. 7, which is similar to FIG. 5 and in which corresponding reference numerals are employed to designate corresponding elements, discloses the stage of fabrication of the MOS circuit at the contact photolithographic step. As in the last-described embodiment, contact openings are selectively formed in the phosphosilicate layer 98, as shown at 108 and 110. In addition, an opening 112 is simultaneously formed in the phosphosilicate glass layer at the gate and source locations of the depletion-mode transistor. This is followed by an ion-implantation procedure in which n-type ions 114 of sufficient energy (p-type for an n-type substrate) are implanted through the polysilicon-oxide gate structure of the depletion-mode device to form, as in FIG. 5, an n-type implantation channel 116 underlying the silicon gate structure. Channel 116, as described previously, modifies the threshold voltage associated with the transistor to form a depletion-mode transistor, as desired.

Thereafter, the metalization pattern is formed to make contacts through the previously formed openings in the phosphosilicate layer to the $V_{ss}$ supply at line 118, to the input at line 120, to $V_{DD}$ supply at line 122, and to the output at line 124. It is to be noted that the metal of line 124 makes contact to both the gate and source of the depletion-mode transistor to achieve the connection of transistor Q1 shown in the circuit of FIG. 8.

Figure 9:
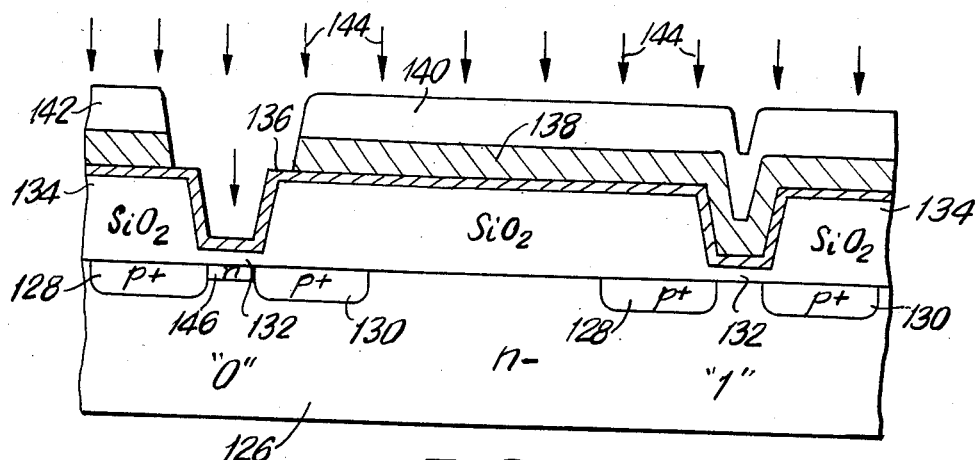
FIG. 9 is a cross-sectional view illustrating yet an additional embodiment of the invention.

FIG. 9 illustrates the programming of a ROM by forming "1" and "0" data storing transistors at selected locations in the data matrix, in which a metal-gate, thick-oxide, MOS structure is coded after the passivation layer has been applied. A p-channel structure is shown in the Figure but, as in all the embodiments of the invention herein described, the MOS structure may be of the opposite polarity (n-channel in this case). More specifically, in FIG. 9 a MOS structure includes an n-type silicon substrate 126 in which p+ source and drain regions 128 and 130 are formed, e.g. by diffusion. Gate insulator films 132 of silicon dioxide and thick silicon oxide regions 134 are conventionally formed and are then covered by a thin layer 136 of n+ doped polysilicon.

Metal is then deposited and etched away to form a metalization layer 138 over the doped polysilicon layer 136. The metal, after it is etched, is in turn used as a mask to etch away the exposed doped polysilicon layer. Thereafter, a passivation layer 140 is deposited over the surface of the wafer.

Windows are etched through selected locations of the passivation layer, such as at 142, over each location at which it is desired to form a "0" storage location. Using the remaining passivation layer as a mask, the exposed metal at the selected locations is etched away to leave the polysilicon layer exposed. An ion-implantation procedure is then carried out utilizing singly-ionized or doubly-ionized phosphorus ions 144, which are of sufficient energy to pass through the exposed polysilicon-silicon dioxide gate structure to create an n-type implanted layer 146, which extends between the source and drain regions 128, 130. For the reasons described previously, the implanted layer shifts the threshold voltage associated with the left-hand transistor in FIG. 9 to create a logic "0" bit, as desired.

The metal (aluminum)-doped polysilicon interconnections achieved in the structure of FIG. 9 will also have a beneficial effect on the elimination of leakage currents caused by aluminum spiking through dislocations through shallow junctions and into the substrate. At contact hole locations, the doped layer of polysilicon will act as a spiking barrier to the penetration of aluminum through the underlying junction during the alloying step. The effectiveness of the doped polysilicon layer will be heavily dependent on its thickness and the degree of order/disorder of the "lattice" associated with the polysilicon material itself.

Figure 10:
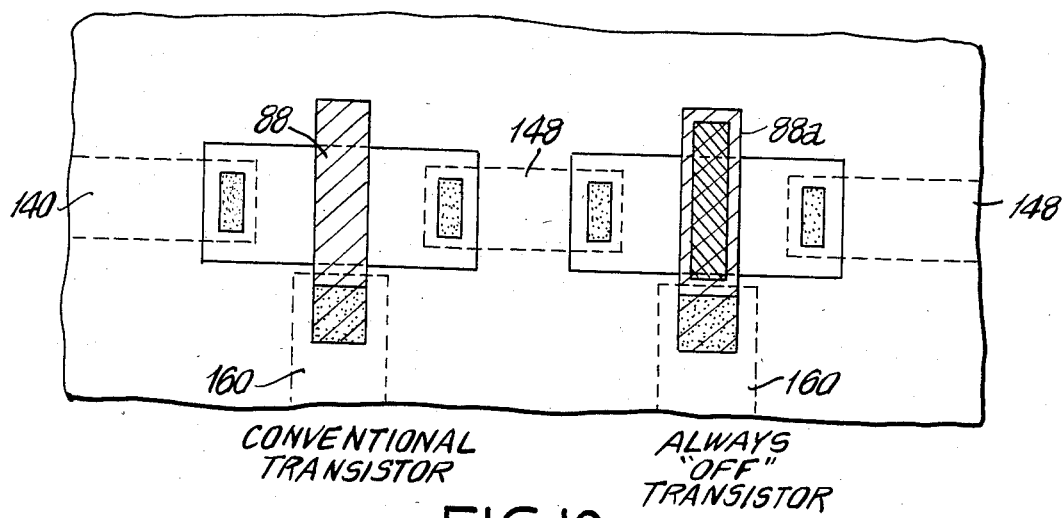
FIG. 10 is a plan view of an MOS device illustrating yet another embodiment of the invention.
Figure 11:
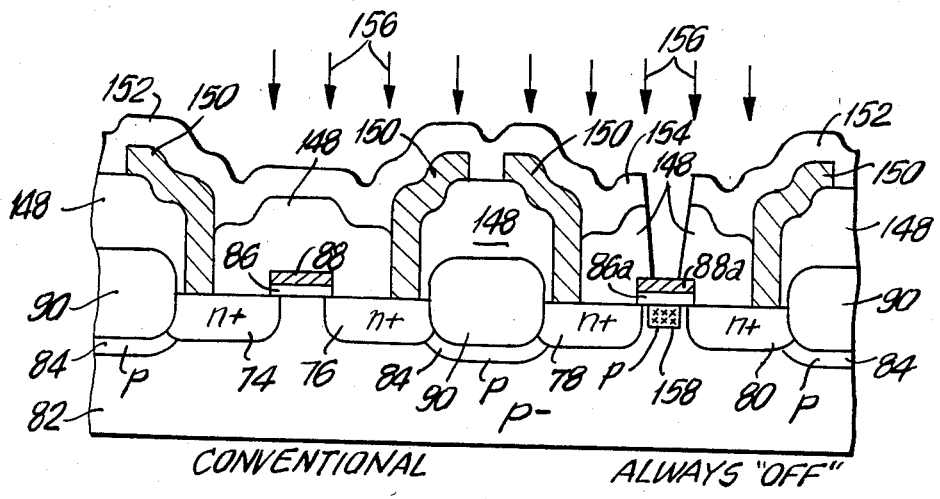
FIG. 11 is a cross-sectional view of the MOS device of FIG. 10.

The embodiment illustrated in FIGS. 10 and 11 is an n-channel ROM which is coded at the same time as the formation of the pad mask. Insofar as the structure of FIGS. 10 and 11 corresponds to that illustrated in FIGS. 4 and 5, corresponding reference numerals are used to designate corresponding elements. As shown in FIG. 11, a phosphosilicate glass layer 148 is formed over the thick oxide regions 90, the polysilicon-oxide gate structures, and the exposed drain and source regions. Next, contact hole openings are formed in the phosphosilicate glass layer 148, and a selectively etched metalization layer 150 is formed which makes contact with the gate, source, and drain regions through these openings. Subsequently, a low-temperature deposited silicon nitride passivating layer 152 is deposited over the surface of the wafer.

To code a ROM during the final photolithographic operation, during which, conventionally, openings are formed in the passivation layer at the desired pad locations, additional openings are formed in the passivation layer at specific locations within the ROM matrix. Thereafter, using the remaining passivation layer and overlying photoresist as a mask, the exposed phosphosilicate glass layer is etched away, typically through the use of either chemical or plasma etching, to form a window 154 which leaves exposed either a portion of, or all of, the polysilicon layer 88a overlying the oxide gate insulator 86a.

Thereafter, an implantation operation utilizing high-energy singly-ionized or doubly-ionized boron ions 156 is performed with any, some, or all of the remaining passivation layer, metalization layer, phosphosilicate layer, or remaining resist acting as an implantation barrier. As a result of the ion implantation, a p-type implanted channel 158 is formed in part of, or throughout, the channel region of the right-hand transistor in FIG. 11, thereby to change the threshold voltage associated with this transistor to place it in the always "off" condition corresponding to a logic "0" condition. A metal contact 160 (FIG. 10) is made to the polysilicon gate structure of this transistor. The left-hand transistor, which was protected by the combined passivation and phosphosilicate layers during the ion implantation, remains unaffected by the ions and is thus in a logic "1" condition.

In summary, the MOS device of the invention is selectively modified, such as the code or program of the bit locations of a ROM, or depletion-mode devices are formed at the final stages of wafer fabrication, and often without the need for additional photolightographic and masking operations. The modification of the MOS device according to the invention may be achieved during the contact, metalization, or pad mask photolithographic operations followed by ion implantation through openings formed during these operations to form an implanted layer at desired gate channel locations, which has the effect of modifying the characteristics of the associated MOS devices.

It will thus be appreciated that a MOS device of the invention can be stored after its fabrication in wafer form, ready, as in the case of a ROM, to be mask-programmed and then passed quickly into final assembly. The invention finds particular utility and importance for use in ROMs and associated input-output circuits for peripheral support circuits on a single chip as is the present trend in the indusry. By the use of this structure, a high-speed microprocessor with on-chip read-only-memories and random-access memories, complete with input-outputs, may be formed on a single chip after which the ROMs and input-output circuits can be programmed after the passivating layer has been deposited on the wafer. A product, which is standard up to virtually the last stages of wafer fabrication, may thus be later customized, or programmed, to meet specification in a small fraction of the time presently required to design and fabricate an MOS custom circuit. The unprogrammed wafers can be kept in inventory until programmed in the final stages of the process.

Although the MOS integrated circuit structure of the invention has been described herein in either an n-channel or p-channel configuration, it is readily applicable to the opposite polarity configuration. It will thus be appreciated that whereas the invention has been specifically described with respect to several presently contemplated embodiments thereof, variations may be made therein, without necessarily departing from the spirit and scope of the invention.

I claim:

1. An M.O.S. integrated circuit comprising a substrate, source, drain, and channel regions of at least first and second M.O.S. transistors being formed in an upper surface of said substrate, a conductive interconnection system formed over said surface of said substrate, said interconnection system including a layer of doped polycrystalline silicon underlying, and being self-aligned with, a metallic layer, an opening selectively formed in said metallic layer, thereby to expose a portion of said layer of doped polycrystalline silicon underlying said opening in said metallic layer, said opening and said exposed portion of said layer of doped polycrystalline silicon directly overlying the channel region of at least one of said first and second transistors at which at least one electrical characteristic is made different from that associated with the other of said first and second transistors by the introduction of impurities into the channel region of said at least one of said first and second transistors through said opening in said metallic layer and the thus exposed portion of said layer of doped polycrystalline silicon.

2. The integrated circuit of claim 1, in which said metallic layer comprises aluminum.

* * * * *